United States Patent
Okuno

(10) Patent No.: US 9,064,996 B2
(45) Date of Patent: Jun. 23, 2015

(54) GROUP III NITRIDE-BASED COMPOUND SEMICONDUCTOR LIGHT-EMITTING DEVICE AND PRODUCTION METHOD THEREFOR

(75) Inventor: Koji Okuno, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 1071 days.

(21) Appl. No.: 12/998,049

(22) PCT Filed: Sep. 17, 2009

(86) PCT No.: PCT/JP2009/066842
§ 371 (c)(1),
(2), (4) Date: Mar. 11, 2011

(87) PCT Pub. No.: WO2010/035849
PCT Pub. Date: Apr. 1, 2010

(65) Prior Publication Data
US 2011/0168974 A1 Jul. 14, 2011

(30) Foreign Application Priority Data
Sep. 25, 2008 (JP) .................... 2008-246199

(51) Int. Cl.
H01L 33/00 (2010.01)
H01L 33/06 (2010.01)
H01L 33/32 (2010.01)

(52) U.S. Cl.
CPC .............. *H01L 33/06* (2013.01); *H01L 33/32* (2013.01)

(58) Field of Classification Search
USPC ........................................... 257/97
See application file for complete search history.

(56) References Cited

U.S. PATENT DOCUMENTS 6,518,082 B1 * 2/2003 Kidoguchi et al. ............. 438/46
6,800,876 B2 * 10/2004 Edmond et al. ................ 257/94

(Continued)

FOREIGN PATENT DOCUMENTS

JP 8-316585 A 11/1996
JP 2000-236142 A 8/2000

(Continued)

OTHER PUBLICATIONS

Taiwanese Office Action dated Nov. 20, 2012, with English translation.

(Continued)

*Primary Examiner* — Jerome Jackson, Jr.
(74) *Attorney, Agent, or Firm* — McGinn IP Law Group, PLLC

(57) ABSTRACT

The object of the present invention is to improve extraction efficiency of light of a Group III nitride-based compound semiconductor light-emitting device of a multiple quantum well structure. The device comprises a multiple quantum well structure comprising a well layer comprising a semiconductor including at least In for composition, a protective layer which comprises a semiconductor including at least Al and Ga for composition and has a band gap larger than a band gap of the well layer and is formed on and in contact with the well layer in a positive electrode side. And also the device comprises a barrier layer comprising a band gap which is larger than a band gap of the well layer and is smaller than a band gap of the protective layer, and formed on and in contact with the protective layer in a positive electrode side and a periodical structure of the well layer, the protective layer and the barrier layer.

15 Claims, 1 Drawing Sheet

(56) References Cited

U.S. PATENT DOCUMENTS

| | | | |
|---|---|---|---|
| 6,906,352 B2 * | 6/2005 | Edmond et al. | 257/94 |
| 7,176,480 B2 * | 2/2007 | Ohtsuka et al. | 257/14 |
| 8,279,904 B2 * | 10/2012 | Sakong et al. | 372/43.01 |
| 2003/0209705 A1 | 11/2003 | Emerson et al. | |

FOREIGN PATENT DOCUMENTS

| | | |
|---|---|---|
| JP | 2000-261106 A | 9/2000 |
| JP | 2001-168471 A | 6/2001 |
| JP | 2001-237456 A | 8/2001 |
| JP | 2004-31770 A | 1/2004 |
| JP | 2004-087908 A | 3/2004 |
| JP | 2004-297098 A | 10/2004 |

OTHER PUBLICATIONS

Japanese Office Action dated Dec. 4, 2012, with partial English translation.

Chinese Office Action dated Aug. 13, 2012, with English translation.

* cited by examiner

GROUP III NITRIDE-BASED COMPOUND SEMICONDUCTOR LIGHT-EMITTING DEVICE AND PRODUCTION METHOD THEREFOR

TECHNICAL FIELD

The present invention relates to a group III nitride-based compound semiconductor light-emitting, device, and to a method for producing the device. As used herein, "Group III nitride-based compound semiconductor" encompasses a semiconductor represented by the formula $Al_xGa_yIn_{1-x-y}N$ ($0 \leq x \leq 1$, $0 \leq y \leq 1$, $0 \leq x+y \leq 1$); such a semiconductor containing a predetermined element so as to attain, for example, an n-type/p-type conduction; and such a semiconductor in which a portion of a group III element is substituted by B or Tl, or a portion of the Group V element is substituted by P, As, Sb, or Bi.

BACKGROUND ART

A group III nitride-based compound semiconductor light-emitting devices whose light emitting layer or active layer have a multiple quantum well structure have been widely used as a light-emitting diode or a laser diode which emits a light with any spectrum in the range from purple to green.

A multiple quantum well structure means, in principle, a periodical structure of the two layers comprising a well layer which is an emission body with the narrowest band gap and a barrier layer whose band gap is wider than the well layer. However, a multiple quantum well layer structure encompasses a periodical structure of three layers having, for example, a well layer, a protective layer or the other layers and a barrier layer.

For example, a Group III nitride-based compound semiconductor light-emitting device is known for the periodical structure of an unit which comprises a well layer comprising InGaN, a protective layer comprising GaN which is formed at the same growth temperature as a well layer is formed at and prevents In from evaporating from just below the well layer, and a barrier layer comprising AlGaN as MQW.

In general, the role of a protective layer comprising GaN is as below.

As has been known, the epitaxial growth temperature of the layer comprising In is less than or equal to 850° C., preferably less than 800° C. The reason to keep the growth temperature low is that In—N binding easily disassociates under the growth of high temperature, that is, In atom is disappeared, and the layer having the desired composition can not be formed. The composition of the well layer on the light-emitting device is an important factor for determining the wavelength of an emitted light. Consequently, in order to stabilize In composition of the well layer, the growth temperature of the well layer is kept less than 800° C.

On the other hand, the barrier layer of the multiple quantum well structure is necessary to confine carriers in the well layer, therefor an energy barrier of the barrier layer should be sufficiently high. The layer comprising Al is employed for this barrier layer. However, when the semiconductor comprising Al is grown under less than 800° C., the semiconductor of high crystallinity can not be obtained. In order to obtain the barrier layer comprising Al of fine crystallinity, the barrier layer should be formed at the temperature of equal to or more than 850° C.

However, when the well layer comprising In is epitaxially grown at the temperature of less than 800° C., then the barrier layer comprising Al is epitaxially grown at the temperature of equal to or more than 850° C., the barrier layer can not be grown in a succession of growth of the well layer. That is, the barrier layer should be grown after elevating a temperature from the growth temperature for the well layer to an optimal growth temperature for the barrier layer. During the heating-up period, however, an atomic binding of the surface of the well layer comprising In which was formed in first was dissolved and In atom was dissociated from the well layer. Accordingly, the composition of the surface of the well layer comprising In which was formed in desired composition was once changed before the barrier layer comprising Al was started to be formed, and moreover, roughness were formed on the surface of the layers. This exerted an important influence on the characteristics of the light-emitting device.

Then, after the well layer comprising In was epitaxially grown at the temperature of less than 800° C., for example, a protective layer comprising GaN was formed on the well layer at the same temperature. Thereby In dissociation from the well layer comprising In was prevented.

[Patent documents 1] unexamined laid open JP, 2001-237456
[Patent documents 2] unexamined laid open JP, 2000-261106

DESCRIPTION OF THE INVENTION

Problems to be Solved by the Invention

In this case, if the film thickness of the protective layer comprising GaN is thin, evaporation of In from the well layer comprising In which was formed in first can not be prevented. Meanwhile, if the film thickness of the protective layer is thick, flatness of the layer becomes worse, because the protective layer is formed relatively at the low temperature.

In addition, because an impurity is ordinarily undoped in the protective layer comprising GaN in the quantum well structure which is the active layer, the thickness of the protective layer increases resistance of a device.

The present inventors have conducted further studies on the aforementioned technique, and have found that efficiency of confining carriers in the well layer is improved, and emitting efficiency of the active layer of the quantum well structure is substantially improved.

Means for Solving the Problem

The present invention is characterized in that in a group III nitride-based compound semiconductor light-emitting device comprising a light emitting layer or an active layer of a multiple quantum well structure, the multiple quantum well structure comprises a well layer, a barrier layer having a band gap larger than that of the well layer and a protective layer having a band gap larger than that of the barrier layer, the protective layer being formed between the well layer and the barrier layer. In addition, the present invention is characterized in that the protective layer is formed at the same temperature as the well layer is formed at.

Accordingly the first aspect of the present invention is a group III nitride-based compound semiconductor light-emitting device comprising a multiple quantum well structure, the multiple quantum well structure device comprising:
a well layer comprising a semiconductor including at least In for composition;
a protective layer which comprises a semiconductor including at least Al and Ga for composition and has a band gap larger than a band gap of the well layer and is formed on and in contact with the well layer in a positive electrode side;
a barrier layer comprising a band gap which is larger than a band gap of the well layer and is smaller than a band gap of the protective layer, and formed on and in contact with the protective layer in a positive electrode side; and a periodical structure of the well layer, the protective layer and the barrier layer.

The second aspect of the invention is that a thickness of the protective layer is equal to or more than 2 Å and less than or equal to 18 Å.

The third aspect of the present invention is a group III nitride-based compound semiconductor light-emitting device comprising a multiple quantum well structure, the multiple quantum well structure device comprising:

a well layer comprising a semiconductor including at least In for composition;

a first protective layer which has a band gap larger than a band gap of the well layer and is formed on and in contact with the well layer in a positive electrode side;

a second protective layer which comprises a semiconductor including at least Al for composition and has a band gap larger than a band gap of the first protective layer and is formed on and in contact with the first protective layer in a positive electrode side;

a barrier layer comprising a band gap which is larger than a band gap of the first protective layer and is smaller than a band gap of the second protective layer, and formed on and in contact with the second protective layer in a positive electrode side; and a periodical structure of the well layer, the first protective layer, the second protective layer and the barrier layer.

In the fourth aspect of the present invention, the thickness of the first protective layer is equal to or more than 2 Å and equal to or less than 18 Å, and the thickness of the second protective layer is equal to or more than 2 Å and equal to or less than 18 Å.

In the fifth aspect of the present invention, the sum of the thickness of the first and second protective layer is equal to or less than or 18 Å.

In the sixth aspect of the present invention, there is provided a well layer and a barrier layer whose thicknesses are equal to or more than 15 Å and equal to or less than 50 Å, respectively, in any one of the first to fifth aspects of the invention.

The seventh aspect of the present invention is that a method for producing a group III nitride-based compound semiconductor light-emitting device comprising a multiple quantum well structure, a method for producing the multiple quantum well structure comprising the steps of:

forming a well layer comprising a semiconductor including at least In for composition at a first temperature;

forming a protective layer which comprises a semiconductor including at least Al and Ga for composition and has a band gap larger than a band gap of the well layer on and in contact with the well layer in a positive electrode side with keeping the first temperature;

forming a barrier layer comprising a band gap which is larger than a band gap of the well layer and is smaller than a band gap of the protective layer on and in contact with the protective layer in a positive electrode side at a second temperature higher than the first temperature by a deviation value equal to or more than 10° C. and equal to or less than 200° C.; and repeating forming the well layer, the forming the protective layer and the forming the barrier layer for a predetermined number of times.

And the eighth aspect of the present invention is that a method for producing a group III nitride-based compound semiconductor light-emitting device comprising a multiple quantum well structure, a method for producing the multiple quantum well structure comprising the steps of:

forming a well layer comprising a semiconductor including at least In for composition at a first temperature;

forming a first protective layer having a band, gap larger than a band gap of the well layer on and in contact with the well layer in a positive electrode side with keeping the first temperature;

forming a second protective layer which comprises a semiconductor including at least Al for composition and has a band gap larger than a band gap of the first protective layer on and in contact with the first protective layer in a positive electrode side with keeping the first temperature;

forming a barrier layer comprising a band gap which is larger than a band gap of the first protective layer and is smaller than a band gap of the second protective layer on and in contact with the second protective layer in a positive electrode side at a second temperature higher than the first temperature by a deviation value equal to or more than 10° C. and equal to or less than 200° C.; and repeating forming the well layer, the forming the first protective layer, the forming the second protective layer and the forming the barrier layer for a predetermined number of times.

Effects of the Invention

According to the present invention, the protective layer comprising a group III nitride-based compound semiconductor whose band gap is larger than the barrier layer is formed just after forming the well layer comprising a semiconductor including at least In. For example, when the barrier layer consists of AlGaN, the layer whose Al composition ratio is higher than that of the barrier layer is employed for the protective layer. Even if the growth temperature for the barrier layer is set higher than that of the well layer, the protection of the well layer comprising In is stronger than that in case of the protective layer comprising GaN in the prior art. Because the protective layer having a high Al composition ratio is formed on the well layer and Al and N atomic binding is stronger than Ga and N atomic binding. Additionally, a film thickness of the protective layer comprising AlGaN whose Al composition ratio is high can be made to be thin compared with the protective layer comprising GaN of the prior art due to the strong Al and N atomic binding. This contributes to reduction in resistance of the quantum well structure such as a light-emitting layer or an active layer. Thus, it becomes possible to decrease the threshold voltage, i.e., the forward voltage, for operating the light-emitting device. And the film thickness of the protective layer comprising AlGaN whose Al composition ratio is high can be thinner compared with the film thickness of the protective layer comprising GaN of the prior art. Therefore, even if the protective layer is formed at the same low temperature as the well layer comprising In is formed at, a flatness of the surface does not become worse. Furthermore, the protective layer has a band gap larger than that of the barrier layer, which helps the barrier layer to confine carriers in the well layer.

This helps to improve light extraction performance of the Group III nitride-based compound semiconductor light-emitting device comprising the emitting layer or the active layer of the multiple quantum well structure.

Studies by the present inventors have shown that when an Al composition of the protective layer is high, distortion due to lattice mismatch between the protective layer and the well layer exert a bad influence on the protective layer. Consequently, the protective layer is preferable to be two-layered comprising, for example, the first protective layer comprising GaN formed directly on the well layer and the second protective layer comprising AlGaN formed on the first protective layer, which enables to achieve the sufficient effect of the present invention.

DESCRIPTION OF NOTATIONS

Figure 1A:
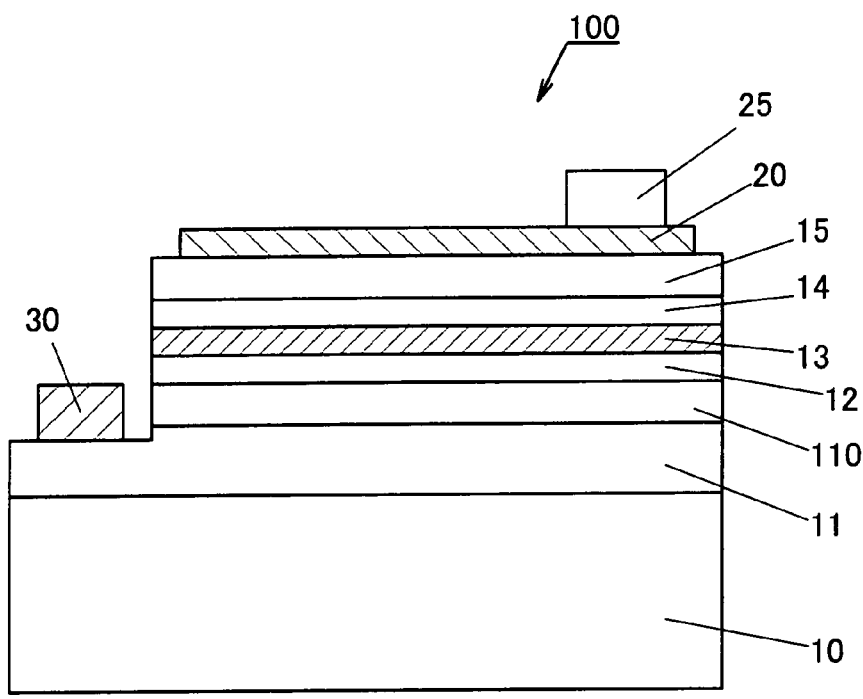
FIG. 1A shows the sectional view showing the structure of a group III nitride-based compound semiconductor light-emitting device concerning the concrete example of the present invention.

100: Group III nitride-based compound semiconductor light-emitting device (Blue LED)
13: light-emitting layer of quantum well structure
131b: Barrier layer
132w: Well layer
133c: Protective layer

BEST MODES FOR CARRYING OUT THE INVENTION

For carrying out the present invention, common knowledge or any prior arts with respect to a Group III nitride-based compound semiconductor light-emitting device can be combined within the range of the above present invention. Regarding to the emitting layer or the active layer of the multiple quantum well layer structure, the following structure is preferable.

It is good to use a group III nitride-based compound semiconductor comprising $In_xGa_{1-x}N$ as the well layer. With respect to the composition ratio of In, the value of x in the above composition formula is preferably within the range of 0.05 to 0.3. It is good for the film thickness of the well layer to be in the range from 15 Å to 50 Å, more preferably the range from 20 Å to 30 Å. It is good for the growth temperature of the well layer to be less than or equal to 850° C., more preferably less than 800° C. in order to avoid dissolving and abscission of In.

With respect to the barrier layer, a group III nitride-based compound semiconductor comprising $Al_xGa_{1-x}N$ is preferable. Regarding to the composition ratio of Al, the value of x in the composition formula is preferably within the range from 0.05 to 0.1. It is good for the film thickness of the barrier layer to be in the range from 15 Å to 50 Å, more preferably the range from 20 Å to 30 Å. It is good for the growth temperature of the barrier layer to be equal to or more than 800° C., preferably more than 850° C. The reason why this temperature range is employed is that crystallinity gets extremely worse when the semiconductor comprising Al is epitaxially grown at the relatively-low temperature. The growth temperature of the barrier layer, however, is preferably less than or equal to 950° C., more preferably 900° C. The reason why this temperature range is employed is that dissolving of the well layer which has been already formed under the barrier layer during the growth of the barrier layer must be avoided.

The difference between the growth temperature of the barrier layer and that of the well layer or the protection layer of a single layer or a multiple layer is preferably within the range from 10° C. to 200° C. When the difference of the temperature is less than 10° C., dissolving of the well layer can not be avoided or crystallinity of the barrier layer is not improved. When the difference of the temperature is more than 200° C., atomic binding is dissolved inside the well layer and crystallinity gets worse while the temperature is increasing for growing the barrier layer.

When the protective layer, i.e., the feature of the present invention, is a single layer, a group III nitride-based compound semiconductor comprising $Al_xGa_{1-x}N$ may be employed. With respect to the composition ratio of Al, the x in the above composition formula is preferably from 0.05 to 0.5. The film thickness of the protective layer is preferably in the range from 2 Å to 18 Å.

When the protective layer comprises two layers of the first layer and the second layer, the first layer is preferably GaN layer having a thickness from 2 Å to 18 Å. The second layer is preferably $Al_xGa_{1-x}N$ having a thickness from 2 Å to 18 Å. With respect to composition ratio of Al, the value of x in the above composition formula is preferably in the range from 0.05 to 0.5.

When the protective layer, the feature of the present invention, is formed, the growth temperature had better not be changed from the growth temperature of the well layer which is formed just under the protective layer, and the growth of the protective layer is to follow that of the well layer just after finishing the growth of the well layer. When the protective layer comprises two layers of the first layer and the second layer, it is preferable that the growth is continuously performed in order of the well layer, the first protective layer and the second protective layer without changing the growth temperature until the growth of the second protective layer is completed.

Embodiment

Embodiments of the present invention will next be described with reference to the drawings. Characteristic features of the present invention described above are also the best mode for carrying out the invention, and the present invention is not limited to the below-described specific embodiments.

Figure 1B:
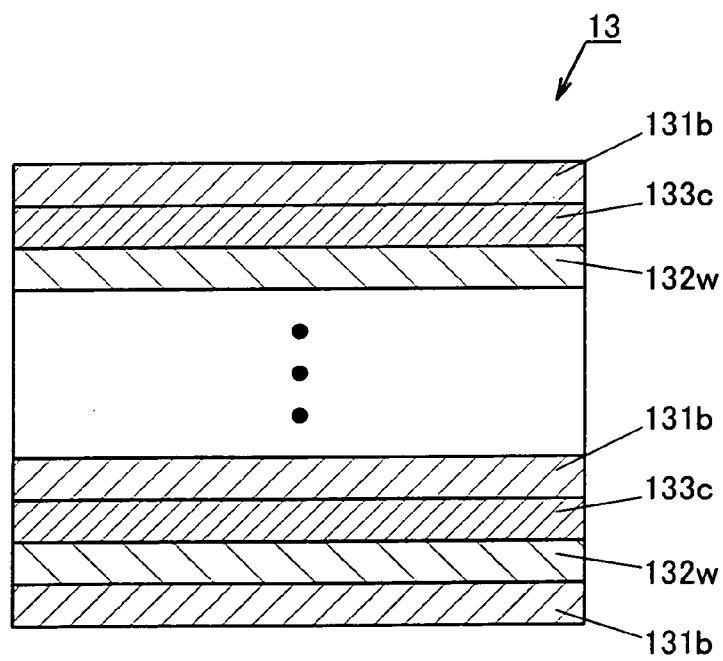
FIG. 1B shows the sectional view showing the layer structure of the light emitting layer 13 of a quantum well structure.

FIG. 1.A is a sectional view showing the construction of the group III nitride-based compound semiconductor light-emitting devices 100 with respect to eight examples of the present invention and a comparative example, which are produced for estimating the effect of the invention. The group III nitride-based compound semiconductor light-emitting devices 100 has an n contact layer 11 made of GaN doped with silicon (Si) having thickness of about 4 μm. The n contact layer 11 is formed on a buffer layer having a thickness of about 15 nm comprising aluminum nitride (AlN), not shown, which is formed on a sapphire substrate 10. On the n contact layer 11, a multiple layer structure comprising an undoped GaN layer having a thickness of 300 nm and a GaN layer doped with silicon (Si) having a thickness of 30 nm is formed as a layer 110 for increasing an electrostatic break down voltage. On the layer 110, an n cladding layer 12 having a total thickness of about 74 nm which comprises the multiple layers is formed. The multiple layers have 10 units, each of which is made of the three layers of undoped $In_{0.1}Ga_{0.9}N$, undoped GaN, and Si-doped GaN.

Here not more than 20 units of the lamination may be used for the n cladding layer 12 and the total film thickness of the layer 12 may be within the range of 50 nm to 150 nm.

On the n cladding layer 12, an light-emitting layer 13, i.e., an active layer, of the multiple quantum well structure (MQW) having 7 units of lamination layers is formed. Each of which has a well layer 132w comprising $In_{0.2}Ga_{0.8}N$ having a thickness of about 3 nm, a protective layer 133c, and a barrier layer 131b comprising $Al_{0.05}Ga_{0.95}N$ having a thickness of about 3 nm in this order. On the light-emitting layer 13, a p cladding layer 14 having a total thickness of about 33 nm which comprises the multiple layers made of p-type $Al_{0.3}Ga_{0.7}N$ and p-type $In_{0.08}Ga_{0.92}N$ is formed. On the p cladding layer 14, a p-type GaN layer 15 having a total film thickness of about 80 nm which comprises lamination structure of p-type GaN whose two layers have different magnesium concentration is formed.

On the p contact layer 15, a transparent electrode 20 comprising indium tin oxide (ITO) is formed and on the exposed surface of the n contact layer 11, an electrode 30 is formed. The electrode 30 comprises vanadium (V) and aluminum (Al) having a thickness of about 20 nm and about 2 μm, respectively. An electrode pad 25 comprising a gold (Au) alloy is formed on the part of the transparent electrode 20.

The group III nitride-based compound semiconductor light-emitting element 100 of FIG. 1 was formed as follows. In this process, the following gasses were employed: ammonia ($NH_3$), carrier gas ($H_2$ or $N_2$), trimethylgallium (Ga$(CH_3)_3$, hereinafter called "TMG"), and trimethylaluminum (Al$(CH_3)_3$, hereinafter called "TMA"), trimethylindium (In$(CH_3)_3$, hereinafter called "TMI"), silicon tetrahydride ($SiH_4$, hereinafter called "silane"), and cyclopentadienyl-magnesium (Mg$(C_5H_5)_2$, hereinafter called "$Cp_2Mg$").

First, a monocrystalline sapphire substrate 10 whose primary crystal growth plane is an a-plane was cleaned through organic cleaning and heat treatment. Then the sapphire substrate 10 was installed on a susceptor laid in a reaction chamber of an MOCVD equipment. Next, the sapphire substrate 10 was baked at the temperature of 1100° C. for about 30 min., with flowing $H_2$ into the reaction chamber at a standard ambient pressure at a flow rate of 2 liter/min.

Next, the temperature of the sapphire substrate 10 was reduced to 400° C., and $H_2$ (20 liter/min.), $NH_3$ (10 liter/min.), and TMA ($1.8\times10^{-5}$ mol/min.) were fed for about one min., to thereby form the AlN buffer layer (thickness: about 1.5 nm) on the substrate 10. Subsequently, the temperature of the sapphire substrate 10 was maintained at 1150° C., and $H_2$ (20 liter/min.), $NH_3$ (10 liter/min.), TMG ($1.7\times10^{-4}$ mol/min.) and 0.86 ppm Silane diluted with $H_2$ gas ($20\times10^{-8}$ mol/min.) were introduced for 40 min., to thereby form the n contact layer 11 (thickness: about 4.0 μm) made of n-type GaN which has an electron concentration of $2\times10^{18}/cm^3$ and a silicon concentration of $4\times10^{18}/cm^3$. Next, the temperature of the sapphire substrate 10 was held at 850° C., the career gas was changed to nitrogen, thereby to form the layer 110 for increasing an electrostatic break down voltage comprising the double layer in which an undoped i-GaN layer having a thickness of 300 nm and an n-type GaN layer having a thickness of 30 nm, silicon concentration of $4\times10^{18}/cm^3$ were deposited in this order.

Next, the amounts of supply of TMG, TMI, and 0.86 ppm $H_2$-diluted Silane were varied to a suitable value for the growth of a next layer under the condition of supplying $N_2$ or $H_2$ and $NH_3$ at a flow rate of 10 liter/min. and 10 liter/min., respectively. Under this condition undoped $In_{0.1}Ga_{0.9}N$ and undoped GaN were grown with maintaining the temperature of the sapphire substrate at 800° C., and Si-doped GaN was grown with maintaining the temperature of the sapphire substrate at 840° C., thereby to form one unit layer comprising the three layers. By repeating the growth process of the three layers at ten times, the about 74 nm thick n cladding layer 12 comprising the multiple layer of 10 unit layers was formed.

After forming the n cladding layer 12, the light-emitting layer 13 of the multiple quantum well structure (MQW) was deposited by varying the supplying amount of TMG, TMI and TMA as following.

At first, the barrier layer 131b comprising $Al_{0.05}Ga_{0.95}N$ was formed in a thickness of about 3 nm by keeping the temperature of the sapphire substrate 10 at 885° C.

Then, the well layer 132w comprising $In_{0.2}Ga_{0.8}N$ was formed in a thickness of about 3 nm by keeping the temperature of the sapphire substrate 10 at 770° C., and subsequently the protective layer 133c was formed at the same temperature.

Next, the barrier layer 131b comprising $Al_{0.05}Ga_{0.95}N$ was formed in a thickness of about 3 nm by keeping the temperature of the sapphire substrate 10 at 885° C.

Such a production process to produce the well layer 132w, the protective layer 133c and the barrier layer 131b was repeated at 7 times.

In this way, the light-emitting layer 13 having a multiple quantum well structure (MQW) was on the first barrier layer 131b of $Al_{0.05}Ga_{0.95}N$, which has 7 units layers, each unit layer having the well layer 132w, the protective layer 133c and the barrier layer 131b (FIG. 1.B).

Here nine light-emitting devices 100 in total was produced for one comparative example and 8 embodiments. In these devices 100 the condition of the respective protective layer 133c of each device 100 is changed, i.e., the number of the protective layer 133c is single or plural, the thickness or the composition of the layer is different. This point will be mentioned later.

Next, the amounts of supply of TMG, TMI, TMA and $Cp_2Mg$ were varied to a suitable value for the growth of a next layer under the condition of supplying $N_2$ or $H_2$ and $NH_3$ at a flow rate of 10 liter/min. and 10 liter/min., respectively, and the temperature of the sapphire substrate was maintained at 840° C. Under this condition the p-type cladding layer 14 having a multiple layers structure was formed in a total thickness of about 33 nm, which comprised p-type $Al_{0.3}Ga_{0.7}N$ and p-type $In_{0.08}Ga_{0.92}N$.

Next, the amounts of supply of TMG and $Cp_2Mg$ were varied to a suitable value for the growth of a next layer under the condition of supplying $N_2$ or $H_2$ and $NH_3$ at a flow rate of 20 liter/min. and 10 liter/min., respectively, and the temperature of the sapphire substrate was increased to 900° C. and kept at the temperature. Under this condition the p contact layer 15 was formed in a total thickness of about 80 nm, which comprised two GaN layers each having different magnesium (Mg) concentration of $5\times10^{19}/cm^3$ and $1\times10^{20}/cm^3$, respectively.

Next, photoresist mask was deposited on the p-type GaN layer 15 and a window was formed in a predetermined region of the photoresist by photolithography. The portion which was is not covered with the mask, i.e., the portion of the p-type GaN layer 15, the p cladding layer 14, the light-emitting layer 13, the n cladding layer 12, and n-type GaN layer 11 corresponding to the window, was etched by reactive ion etching using the gas containing chlorine. Thereby the surface of the n type GaN layer 11 was exposed. Next, after removing the resist mask, the n electrode 30 to the n-type GaN layer 11 and the p electrode 20 to the p-type GaN layer 15 were formed in the following procedures.

The transparent electrode 20 was formed in a thickness of 200 nm on the entire surface of a wafer. Next, after patterning the mask for the p electrode 20 by depositing photoresist and a photolithography, the p electrode 20 was fabricated in desired shape by dry etching.

Next, after forming a window in a predetermined region of the exposed surface of the n-type GaN layer by depositing photoresist and a photolithography, the n electrode 30 to the n-type GaN layer 11 was formed with the vacuum deposition method in the high vacuum below $10^{-6}$ Torr order.

Next, the photoresist was removed by a lift off method and the n electrode 30 was formed in a desired shape. Then, the wafer was heat-treated at 600° C. for 5 min. in atmosphere containing nitrogen gases. Thereby alloying the n electrode 30 to the n type GaN layer 11 and decreasing resistance of the p-type GaN layer 15 and the p cladding layer 14 was performed.

Nine group III nitride-based compound semiconductor light-emitting devices 100 was produced as described above in which the protective layer had nine kinds of variation for the number of layers and the composition of layers. And characteristics of the nine devices were measured. The results are shown in the following table. On the left column of the table 1, 'ref' means the device according to the comparative example of prior art in which the protective layer is a single layer of GaN. The 'ex1~ex8' on the left column of the table 1 shows the devices according to the embodiments 1 to 8 of the present invention, respectively.

TABLE 1

| | Protective layer | | | Property (reraltive value) | | | |
| | | AlGaN | | | | | |
| | GaN thickness (Å) | thickness (Å) | Al composition (atom %) | intensity of emitted light | total radiant flux | forward voltage | backward current |
|---|---|---|---|---|---|---|---|
| ref | 18 | x | x | 1 | 1 | 1 | 1 |
| ex1 | 12 | 6 | 6 | 1.09 | 1.06 | 1.00 | 0.80 |
| ex2 | 6 | 6 | 6 | 1.22 | 1.08 | 0.99 | 0.58 |
| ex3 | 0 | 6 | 6 | 1.22 | 1.08 | 0.99 | 0.58 |
| ex4 | 6 | 6 | 12 | 1.23 | 1.08 | 0.99 | 1.90 |
| ex5 | 6 | 6 | 18 | 1.24 | 1.09 | 1.01 | 0.80 |
| ex6 | 6 | 6 | 24 | 1.27 | 1.11 | 1.00 | 2.20 |
| ex7 | 0 | 12 | 6 | 1.29 | 1.08 | 1.01 | 1.60 |
| ex8 | 0 | 12 | 24 | 1.27 | 1.11 | 1.01 | 2.50 |

In the table 1, the protective layer is made of the GaN layer and the AlGaN layer, and the thickness of the GaN layer and the thickness and the Al composition percent (atom %) of the AlGaN layer are listed. But when only the AlGaN single layer is used, the thickness of the GaN layer is described as 0 Å. Since the AlGaN layer is not used as the protective layer in the comparative example, the thickness of the AlGaN layer and the Al composition percent are crossed.

Embodiments 3, 7 and 8 (ex 3, 7 and 8) shows the case which the protective layer is made of the AlGaN single layer, embodiments 1, 2, 4 and 6 (ex 1, 2, 4 and 6) shows the case which the protective layer is made of the first protective layer comprising GaN and the second protective layer comprising AlGaN in the present invention, respectively.

In the table 1, values of intensity, total radiant flux of emitted light, forward voltage as threshold voltage, and backward current flowing at reverse voltage are described with respect to the embodiments 1~8 (ex 1~8). The Vales are normalized by the value of the comparative example (ref), i.e., the Vales are relative values or ratio to the value of the comparative example when the value of the comparative example is normalized to 1. The larger the relative value becomes, the intensity and the total radiant flux of emitted light have good properties, on the other hand, the smaller the relative value becomes, the forward voltage and the backward current have good properties.

[Review of the Results]

From the results of the table 1, the followings are concluded.

In case that MQW structure have a periodical structure of the three layers consisting of an InGaN well layer/a protective layer/an AlGaN barrier layer, when the protective layer, being formed at the same temperature as the InGaN well layer is deposited at, is a single layer, the AlGaN layer is more preferable than the GaN layer.

That is the devices of the embodiments 1 to 3 (ex1 to ex3 in the table 1), having at least 6 Å thick $Al_{0.06}Ga_{0.94}N$ layer as the protective layer, are superior to the device of the comparative examples (ref in the table 1), having single 18 Å thick GaN layer as the protective layer, in all characteristics of the intensity, the total radiant flux, the forward voltage and the backward current.

In addition, it is understood that forming the GaN layer in advance of forming the $Al_{0.06}Ga_{0.94}N$ layer of 6 Å thickness is meaningless. That is if the $Al_{0.06}Ga_{0.94}N$ layer is employed as the protective layer, forming GaN layer as the first protective layer just after forming the InGaN well layer is meaningless.

It is understood from the embodiments 2 and 4 to 6 (ex2 and ex4 to ex6 in the table 1) that the emission intensity and the total radiant flux are improved along with the Al composition percent of the second protective layer being larger in case of forming the second protective layer having the thickness of 6 Å after forming the first protective layer having the thickness of 6 Å. And also it is understood that the forward voltage is not varied so much, however the backward current increases twice as much as that of the comparative example.

Compared with the device which has the second protective layer comprising AlGaN having a thickness of 6 Å after forming the first protective layer comprising GaN having a thickness of 6 Å and the device which has the single protective layer comprising AlGaN having a thickness of 12 Å, that is the total thickness and Al composition percent is not varied in the both devices, the results is as below.

When the Al composition percent is small such as 6%, it is understood that the backward current increases significantly even though the emission intensity is enhanced in the embodiment 7 having no GaN layer compared with the embodiment 2 having GaN layer.

When the Al composition percent is large such as 24%, it is understood that the backward current increases even though the emission intensity, the total radiant flux and the forward voltage are not varied in the embodiment 8 having no GaN layer compared with the embodiment 6 having GaN layer.

As stated above, the protective layer, which is formed on the well layer comprising InGaN at the same temperature as the well layer is formed at, have sufficient effect only if the protective layer has the AlGaN layer having a thickness of 6

Å, i.e., a length corresponding to the length of the fundamental vector c of an unit cell in a crystalline lattice of AlGaN. The protective layer may be the two-layered structure like GaN layer and AlGaN layer, however, when the thickness of GaN layer is thicker, the effect is small. On the other hand, when AlGaN whose aluminum composition percent is higher is employed as the protective layer, it is preferable that the protective layer is made to be two-layered structure and the first protective layer comprising GaN is deposited between the well layer and the second protective layer comprising AlGaN.

The invention claimed is:

1. A group III nitride-based compound semiconductor light-emitting device comprising:
   a multiple quantum well structure, said multiple quantum well structure device comprising:
   a well layer comprising a semiconductor including at least In for composition;
   a first protective layer which has a band gap larger than a band gap of said well layer and is formed on or above said well layer in a positive electrode side;
   a second protective layer which comprises a semiconductor including at least Al for composition and has a band gap larger than a band gap of said first protective layer and is formed on or above said first protective layer in a positive electrode side;
   a barrier layer comprising a band gap which is larger than a band gap of said first protective layer and is smaller than a band gap of said second protective layer, and formed on or above said second protective layer in a positive electrode side; and
   a periodical structure of said well layer, said first protective layer, said second protective layer and said barrier layer.

2. The group III nitride-based compound semiconductor light-emitting device according to claim 1, wherein a thickness of said first protective layer is equal to or more than 2 Å and less than or equal to 18 Å and a thickness of said second protective layer is equal to or more than 2 Å and less than or equal to 18 Å.

3. The group III nitride-based compound semiconductor light-emitting device according to claim 2, wherein a sum of the thickness of said first protective layer and said second protective layer is less than or equal to 18 Å.

4. The group III nitride-based compound semiconductor light-emitting device according to claim 1, wherein the thickness of said well layer is equal to or more than 15 Å and less than or equal to 50 Å, and the thickness of said barrier layer is equal to or more than 15 Å and less than or equal to 50 Å.

5. The group III nitride-based compound semiconductor light-emitting device according to claim 2, wherein the thickness of said well layer is equal to or more than 15 Å and less than or equal to 50 Å, and the thickness of said barrier layer is equal to or more than 15 Å and less than or equal to 50 Å.

6. The group III nitride-based compound semiconductor light-emitting device according to claim 3, wherein the thickness of said well layer is equal to or more than 15 Å and less than or equal to 50 Å, and the thickness of said barrier layer is equal to or more than 15 Å and less than or equal to 50 Å.

7. A method for producing a group III nitride-based compound semiconductor light-emitting device comprising: producing a multiple quantum well structure, the method for producing said multiple quantum well structure comprising:
   forming a well layer comprising a semiconductor including at least In for composition at a first temperature;
   forming a first protective layer having a band gap larger than a band gap of said well layer on or above said well layer in a positive electrode side with keeping said first temperature;
   forming a second protective layer which comprises a semiconductor including at least Al for composition and has a band gap larger than a band gap of said first protective layer on or above said first protective layer in a positive electrode side with keeping said first temperature;
   forming a barrier layer comprising a band gap which is larger than a band gap of said first protective layer and is smaller than a band gap of said second protective layer on or above said second protective layer in a positive electrode side at a second temperature higher than said first temperature by a deviation value equal to or more than 10° C. and equal to or less than 200° C.; and
   repeating forming said well layer, said forming said first protective layer, said forming said second protective layer and said forming said barrier layer for a predetermined number of times.

8. The group III nitride-based compound semiconductor light-emitting device according to claim 1, wherein said barrier layer comprises a semiconductor including at least Al.

9. The group III nitride-based compound semiconductor light-emitting device according to claim 1, wherein said barrier layer comprises $Al_xGa_{1-x}N$.

10. The group III nitride-based compound semiconductor light-emitting device according to claim 1, wherein said first protective layer comprises GaN.

11. The group III nitride-based compound semiconductor light-emitting device according to claim 1, wherein the second protective layer comprises $Al_xGa_{1-x}N$, where x is in a range from 0.05 to 0.5.

12. The group III nitride-based compound semiconductor light-emitting device according to claim 1, wherein the well layer comprises $In_xGa_{1-x}N$, where x is in a range from 0.05 to 0.3.

13. The group III nitride-based compound semiconductor light-emitting device according to claim 1, wherein the barrier layer comprises $Al_xGa_{1-x}N$, where x is in a range from 0.05 to 0.1.

14. The group III nitride-based compound semiconductor light-emitting device according to claim 1, wherein the first protective layer is formed on and contacts a surface of the well layer.

15. The method for producing a group III nitride-based compound semiconductor light-emitting device according to claim 7, wherein the forming of the well layer, the forming of the first protective layer and the forming of the second protective layer are continuously performed without changing a growth temperature, until the forming of the second protective layer is completed.

* * * * *